United States Patent [19]
Chawla et al.

[11] Patent Number: 5,726,603
[45] Date of Patent: Mar. 10, 1998

[54] LINEAR RF POWER AMPLIFIER

[75] Inventors: Yogendra K. Chawla, Pittsford; Leonid Reyzelman, Rochester, both of N.Y.

[73] Assignee: ENI Technologies, Inc., Rochester, N.Y.

[21] Appl. No.: 800,336

[22] Filed: Feb. 14, 1997

Related U.S. Application Data

[60] Continuation of Ser. No. 441,962, May 16, 1995, abandoned, which is a division of Ser. No. 275,124, Jul. 14, 1996, Pat. No. 5,477,188.

[51] Int. Cl.[6] ......................................................... H03F 3/26
[52] U.S. Cl. ........................................... 330/269; 330/276
[58] Field of Search ................................... 330/269, 276, 330/301

[56] References Cited

U.S. PATENT DOCUMENTS

| | | | |
|---|---|---|---|
| 3,714,597 | 1/1973 | Reynolds | 330/117 X |
| 3,801,882 | 4/1974 | Ward | 333/84 M X |
| 3,911,327 | 10/1975 | Murari et al. | 357/79 X |
| 4,069,497 | 1/1978 | Steiditz | 357/79 X |
| 4,097,814 | 6/1978 | Cohn | 330/286 |
| 4,112,386 | 9/1978 | Everhart et al. | 330/276 X |
| 4,180,781 | 12/1979 | Kaplan | 330/272 |
| 4,288,839 | 9/1981 | Prager et al. | 361/386 |
| 4,302,727 | 11/1981 | Iwamatsu | 330/266 |
| 4,647,867 | 3/1987 | Butler et al. | 330/269 |
| 4,674,005 | 6/1987 | Lacz | 361/388 |
| 4,727,554 | 2/1988 | Watanabe | 372/36 |
| 4,733,194 | 3/1988 | Roehrs et al. | 330/251 |
| 4,739,447 | 4/1988 | Lecomte | 361/386 |
| 4,853,828 | 8/1989 | Penn | 361/386 |
| 4,899,116 | 2/1990 | Roehrs et al. | 330/251 |
| 4,945,317 | 7/1990 | Sato et al. | 330/301 |
| 4,990,987 | 2/1991 | Boucher et al. | 357/75 X |
| 5,010,304 | 4/1991 | Mueeller et al. | 330/269 |
| 5,027,082 | 6/1991 | Wisherd et al. | 330/277 |
| 5,130,888 | 7/1992 | Moore | 361/386 |
| 5,420,537 | 5/1995 | Weedon et al. | 330/276 X |

FOREIGN PATENT DOCUMENTS

| | | | |
|---|---|---|---|
| 0002640 | 6/1979 | European Pat. Off. | 330/276 |
| 0023546 | 3/1978 | Japan . | |
| 0269305 | 10/1989 | Japan | 330/276 |

*Primary Examiner*—Steven Mottola
*Attorney, Agent, or Firm*—Trapani & Molldrem

[57] ABSTRACT

A linear RF power amplifier employs push-pull pairs of high voltage mosfets. A minimum of transformers is employed, with an impedance matching transformer feeding an input balun supplying the input signal in push-pull to the gates of the mosfets. The drains are coupled to balanced legs of an output balun, followed by an output impedance matching transformer. Thermal sensors are employed for control of gate bias and also for control of drain voltage. The temperature sensors are mounted in the air inlet path and on the spreader plate of the heat sink. An aluminum or fiberglass strap is used to press the transistors against the spreader plate thereby ensuring good thermal contact with the transistor dies.

12 Claims, 6 Drawing Sheets

LINEAR RF POWER AMPLIFIER

This is a continuation of application Ser. No. 08/441,962, filed May 16, 1995, now abandoned, which is a divisional of application Ser. No. 08/275,124, filed Jul. 14, 1994, now U.S. Pat. No. 5,477,188, Dec. 19, 1995.

BACKGROUND OF THE INVENTION

This invention relates to power amplifiers and is more particularly directed to pulsed RF power amplifiers of the type in which several fets or other amplifying devices are combined together to amplify an RF input signal. The invention is more specifically directed to a technique of controlling the bias levels of the amplifying devices so that they are kept at a desired operating point in their active regions over a wide range of die temperature.

Transistors or other amplifying devices have an active region in which there is a substantially linear relationship between gate or grid voltage and drain or plate current. For example, in a linear Class A amplifier, a bias level is selected so that when a null signal is applied to the grid, gate or other control electrode, the output current is at a desired quiescent level in about the center of the linear part of the device's active region. Because operating characteristics such as threshold voltage, transconductance, etc., of the amplifying device will change, due to aging, temperature drift or other reasons, bias control techniques have been used to maintain a reasonably constant bias current in the transistors or other devices used in the gain stages of an RF power amplifier. One proposed bias control technique for an RF amplifier is described in Erb et al. U.S. Pat. No. 4,924,191.

Low power amplifiers can include a source degeneration resistor and a simple biasing network between drain and gate to provide a stable bias current. This lowers the available drain voltage, power gain and power output. However, high power devices tend to have much smaller gains than low power devices, and this requires an increased size and operating cost for the devices, when passive gain control techniques are used. Resisters in the source-drain path affect gain and create an output power loss. This is unacceptable in high power amplifiers where any power loss will result in the need for additional power stages or an increased number of paralleled devices.

If the high power amplifier is operated continuously, it can employ a technique that measures drain current and adjusts the gate voltage so as to keep constant the dc component of the drain current.

However, for many applications it is necessary for the amplifier to be designed for pulsed operation. In that case a static feedback network is not feasible to maintain a constant bias. This results because there is no current output flowing when the amplifier is gated off, so no bias measurement can be taken between pulses.

A previously proposed solution to this problem involves gating each amplifying device in turn while applying a null or zero input. The bias current for each device is measured and the results of this measurement are supplied to a processor that controls the respective bias levels. This technique requires a test mode, in which the amplifying elements are forward biased and a null input signal is applied. However, there is no provision for creating a null region for each occurrence of a pulsed input signal. Also, if the amplifier is to be operated in a continuous mode, the technique requires that a forced idle condition be imposed in turn on each of the amplifying elements. Thus, the effect is that the amplifier will not operate in a continuous mode.

This technique also has drawbacks in that it imposes unacceptable conditions on the user because of its forced idle requirement. Additionally, the feedback correction in this technique cannot prevent failure from thermal runaway for many types of transistors.

Another technique to control bias compensation is to employ a temperature compensation network. This corrects for thermal drift of the fet gate to source threshold voltage. This system his the advantages of operating whether the amplifier is used continuously or intermittently. However, because of its open-loop nature, this technique does suffer certain drawbacks. Each fet or other device requires adjustment to set the initial bias to the required level. This most often involves a potentiometer that is set by hand. Also, the thermal drift characteristic of each fet has to match, or an adjustment has to be made during manufacture to compensate for variance in thermal drift.

Recently some circuit designers have begun to consider high voltage mosfets for use in power amplifiers as a means to reduce cost and size of the amplifier. These fets, which are more commonly employed in switching power supplies, have a much more abrupt gate voltage to drain current characteristic than an RF power mosfet. This makes a simple thermal compensation scheme difficult and costly to implement. These low cost fete are also very sensitive to thermal variations, which can cause thermal runaway. If this sensitivity is not addressed adequately, destruction of the device can result. That is, threshold voltage change because of temperature change is a serious problem. The fact that the gate voltage to drain current characteristic is steeper and more abrupt as compared with RF power mosfets results in a faster, more extreme thermal runaway.

Additional problems arise where the high voltage mosfets are employed in a linear RF pulse power amplifier for low-band (5 to 25 MHZ) magnetic resonance imaging (MRI). When these fets are used, it is necessary not only to select an appropriate high voltage mosfet, but care must be exercised in design of the push-pull circuitry for each pair of transistors; thermal compensation of gate bias is needed to achieve dynamic linearity and gain stability. Thermal control of B+ supply, i.e. drain voltage, is required to achieve gain stability, and the cooling system must be optimally designed for management of heat, i.e., to cool the transistors evenly with highly efficient heat transfer.

The linear RF amplifier has to be designed so that each push-pull transistor pair amplifies evenly over the entire low band (5–25 MHz) with a high flatness characteristic around each given imaging frequency. The dynamic linearity must be maintained as high as possible over a wide range of pulse widths and duty cycles. That is, the output power to gain response over the specified dynamic range (40 dB) should be within a ±1.0 dB window.

Gain stability is defined as the variation of gain (for both long term and short term) at a specified peak RF output level. Gain stability should be maintained at ±0.2 dB for 15 minutes of operation, and at ±1.0 dB for 5000 hours of operation.

Phase stability is defined as variation of phase over the specified dynamic range and over time at a specific power level. The phase stability should be between ±2° and ±5°, for short and long term, respectively.

Pulse droop is defined as the variation of peak RF output power over the pulse width for a specific output and duty cycle. Pulse droop should be within ±0.2 dB.

Pulse rise and fall times should be less than 25 μsec, measured between the 10% and 90% levels of RF output.

The gated-on noise figure should be less than 27 dB for the overall system. This corresponds to less than −80 dBm/Hz gated-on output noise floor.

The gated-off noise figure should be no greater than 20 dB for the overall system, or a gated-off noise floor of less than −154 dBm/Hz.

The amplifier must be able to deliver the minimum specified power level into a variety of voltage standing wave ratio loads, or VSWRs. The amplifier must have maximum output power capability into mismatched loads, so as to be useful for initial MRI system calibration.

At the present time, solid-state amplifiers utilize RF power mosfets which are designed and characterized for linear RF applications. The highest design operating frequency is less than the transistor's specified maximum frequency. The transistor's internal capacitances, $C_{ISS}$, $C_{RSS}$ and $C_{OSS}$ are at low and have negligible effect on the overall source and load impedances. The RF power mosfets typically operate at 50 volts drain to source, and a pair in push-pull can provide peak output power of 400 watts, with a power gain of 13 dB. A typical MRI application requiring five kilowatts of peak RF power needs, sixteen push-pull pairs.

On the other hand, high voltage mosfets, having a 400 volt breakdown characteristic and a 310 watt average dissipation capacity, can be operated at a nominal 85 volts drain to source, with a 10 dB power gain and 900 watts peak output power. This means that only eight push-pull pairs are needed to achieve a total peak output power of five kilowatts with a sufficient voltage breakdown margin to operate into high VSWRs. The mosfet has greater than a 4:1 drain to source breakdown margin for 85 volts drain voltage to avoid voltage breakdown. Meanwhile, the RF input drive power level is kept the same as for the rated output regardless of load mismatch.

Therefore, because of the higher power and impedance mismatch capability of the high voltage mosfets, and also because of the lower cost of these than the RF power mosfets, any power amplifier that implements the high voltage mosfets would be extremely attractive.

Because of gain stability and dynamic linearity problems, however, these transistors cannot simply be substituted in place of the RF power mosfets. Instead problems of drain bias stability, gain stability, and dynamic linearity must be taken into account. Means for dealing with these issues have not been addressed in the prior RF amplifier arts, even through the problems presented are by no means trivial.

OBJECTS AND SUMMARY OF THE INVENTION

It is an object of this invention to provide a reliable but low cost RF amplifier which can deliver RF at high power and avoids the drawbacks of the prior art.

It is a more specific object of this invention to provide drain bias control and drain supply control to maintain the transistor in the active range to achieve linear amplification with good stability, for various pulse widths and duty cycles over a wide range of temperature.

It is a more particular object to provide drain bias control which is independent of the mode of operation of the amplifier or of the RF frequency involved.

It is a further object to provide a gain stability and dynamic linearity feature for the RF power amplifier which is simple and inexpensive to implement.

It is a further object to apply heat management principles to maintain thermally stable transistor operation to implement drain bias control and drain supply control for an RF power amplifier.

In accordance with an aspect of the present invention, the RF power amplifier stage contains a number of parallel push-pull RF power amplifier circuits. Each of these amplifier circuits comprises a first and a second high voltage mosfet with the drains coupled to a source of drain voltage, e.g. a nominal 85 volts. An RF input signal is applied, from an upstream stage to an input terminal. A first impedance matching transformer, which is of single-ended or unbalanced design, has a high impedance input coupled to the input terminal and a low impedance output coupled to an unbalanced input of a balun transformer, which has first and second balanced outputs respectively coupled to the gates of the first and second fets. There are also respective bias circuits that apply bias levels to the gates of the fets. An output balun has first and second inputs connected to the drains of the respective fets and an unbalanced output that is coupled to a low impedance input of an output impedance matching transformer. This matching transformer has a high impedance output that is coupled to an RF output terminal and thence to a downstream stage. In practice, the outputs of a number of push-pull amplifiers are coupled to a combiner network to produce the required high power. The impedance matching transformers have impedance ratios of 4:1 and 1:4 respectively, to match 50 ohms to 12.5 ohms. With the impedance matching transformers disposed outside the balun transformers, only four transformers are required rather than six according to the more conventional configurations. The internal capacitance of the high voltage mosfets are relatively large and their effects on the source and drain impedances are not negligible. This configuration is better suited to absorb $C_{ISS}$ and $C_{OSS}$ capacitances via the balun transformer winding inductances.

In a preferred embodiment a reversing transformer is employed between the drains of the fets and the supply of drain voltage.

The fets are heat producing derides except when operated in the full on and cut off modes. In continuous operation, each fet can dissipate an average of 310 watts. In pulse operation, each fet has a dissipation capability of 1250 watts peak for a pulse width of 6 milliseconds and a duty cycle of 10%, or 1785 watts peak for a pulse width of 3 milliseconds and a duty cycle of 5%. The heat produced should flow as evenly as possible to a heat sink to keep the fets operating within their thermal limits. The circuit design should keep the fet junction temperature below 115° C. to provide a margin for acceptable transistor life time, well below the 150° C. maximum junction temperature. For the fets employed in one embodiment, the average thermal impedance from junction to case is about 0.4° C. per watt, and the thermal impedance for pulsed operation is much lower. The thermal impedance for 3 ms pulse width and 5% duty cycle is 0.07° C. per watt. For 6 ms pulse width and 10% duty cycle, thermal impedance is 0.1° C. per watt. To maintain dynamic linearity within a ±1.0 dB window, the drain bias should be 250 mA. The gate to source threshold voltage should be between 2.7 and 4.7 volts.

These transistors have a typical gate-source voltage shift of ±5 mv per degree Celsius. The gate-source threshold shift over 25° C.–75° C.–25° C. temperature cycle should also be less than ±5 mv.

The drain-source on-resistance $R_{DS-ON}$ is about 0.20 ohm which determines the drain efficiency and output power capability. The resistance $R_{DS-ON}$ increases with die temperature which lowers the available drain-source voltage, affecting gain stability. This can typically involve a 40% increase in $R_{DS-ON}$ for a temperature rise of 25° to 75° C.

The gate-source threshold decreases with temperature, thereby increasing drain bias current for a given gate-source bias voltage. This affects both gain stability and dynamic linearity. Proper drain bias current is determined empirically for optimal dynamic linearity. The control of drain current determine the dynamic linearity and gain stability of the amplifier. The shift over time in gate-source voltage determines the drain bias current stability limit. This can be stabilized using thermal feedback control.

Transistor forward transconductance $g_{fs}$ is typically 9.5 to 13.5 Siemens, for a drain current of 10 amperes. For lower current levels, 250 mA, forward transconductance $g_{fs}$ is 1.2–2.2 Siemens.

Forward transconductance determines the power gain and drain bias, which affects both dynamic linearity and amplifier gain.

Dynamic capacitances of the fets also affect the gain and gain stability. Input capacitance ($C_{ISS}$) can typically be up to 2950 pf. This determines the RF gain capability of the amplifier, and the highest useful frequency (assume 8 dB minimum gain). Reverse transfer capacitance ($C_{RSS}$) can be up to 310 pf. This determines the RF stability of the amplifier and its capability to operate into high VSWR loads. Output capacitance ($C_{OSS}$) can be up to about 750 pf. This determines the drain efficiency and output power capability of the amplifier, and the usable highest frequency (assume 50% minimum drain efficiency).

With the amplifier circuit of this invention, the equivalent series capacitor reactances due to the internal capacitances $C_{ISS}$, $C_{RSS}$, $C_{OSS}$ are absorbed by the series inductances of the input and output balun windings at both gate and drain terminals.

In order to control temperature of the fets and manage the heat flow, the first and second transistors of each push-pull pair are mounted on a copper spreader plate which is part of the heat sink. An aluminum or fiberglass strap is mounted onto the spreader plate sandwiching the transistors between the strap and the plate. Each transistor has a copper base that permits transfer of heat from the active semiconductor region, or die to the spreader plate. The strap is positioned to press against the die regions so that heat is transferred efficiently down into the heat sink. A thermal sensor device e.g., a tempsistor is mounted on the spreader plate between the two transistors, and outputs a signal that varies as a function of temperature. This is coupled to bias control stabilization circuitry to adjust the gate bias voltage and/or to vary the drain voltage to maintain gain stability and dynamic linearity.

The RF power amplifier can include a gain stability compensation circuit that controls the source of supply voltage to adjust the drain supply voltage in response to changes in the die temperature of the transistors. The gain stability compensation circuit can include means for measuring ambient inlet air temperature in the amplifier's chassis, and a differential circuit that develops a difference signal based on the difference in temperature between ambient inlet air and the transistors by measuring heatsink temperature. The gain stability circuit can further include a power integration circuit to generate an integration signal that represents a time integral of the amplifier output power. This signal is combined with the difference signal to produce a reference signal that is fed to control the drain supply voltage.

BRIEF DESCRIPTION OF THE DRAWING

The above and many other objects,. features, and advantages of this invention will become apparent from the ensuing description of a preferred embodiment, to be read in conjunction with the accompanying drawing, wherein.

DETAILED DESCRIPTION OF THE PREFERRED EMBODIMENT

Figure 1:
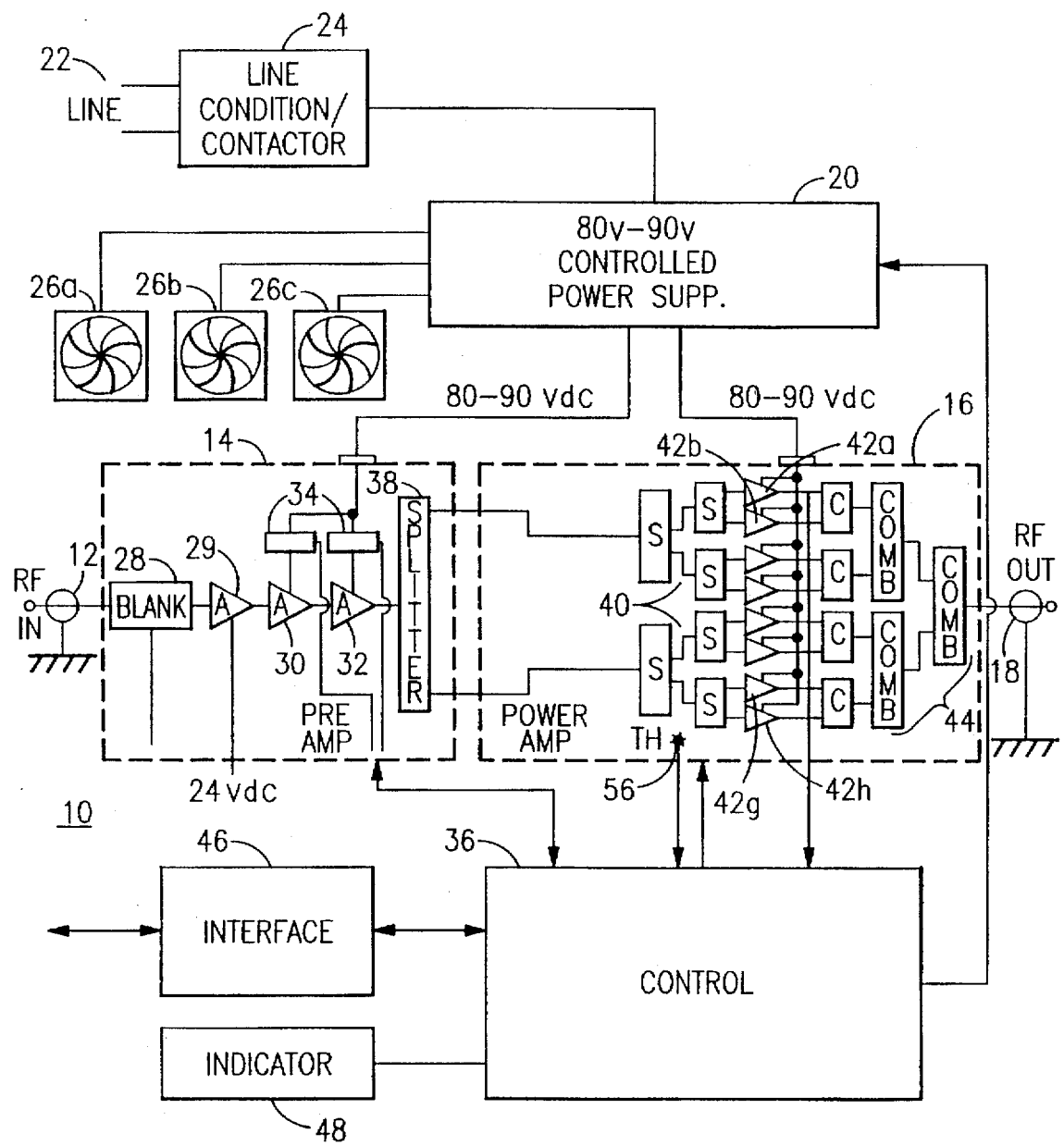
FIG. 1 is a block diagram of an RF power amplifier according to one preferred embodiment of this invention.

With respect to the drawing, an RF power amplifier 10 in block diagram is shown in FIG. 1, and comprises in sequence an RF input 12, a preamplifier 14, a power amplifier 16 and an RF output 18. A controlled power supply 20 provides a nominal 85 volts dc as drain supply voltage, and also supplies other voltages as necessary, i.e., 24 vdc, 5 vdc, +12 vdc and −12 vdc. A line voltage connection 22 is connected to line voltage, e.g. 208 vac which is fed through a line conditioner and contactor 24 to the controlled power supply 20. The latter also furnishes a suitable level of power to a bank of cooling fans 26a, 26b, 26c.

In the preamplifier 14, the input RF signal is fed from the input 12 to a blanking circuit 28 that attenuates the input signal at blanking intervals. This is followed by a first amplifier 29 a second amplifier 30, and a third amplifier 32. Drain voltage is supplied to the amplifiers 30, 32 through sensing devices 34, which supply voltage as a measurement of drain bias current to a control circuit 36. The third amplifier 32 feeds a inphase splitter 38 that provides a pair of outputs, each 50 ohms impedance, and at a peak power of about 250 watts.

Not shown here are input protection circuitry and gain sloping circuitry.

The outputs of the inphase splitter 38 are coupled to a group of cascade inphase splitters 40 in the power amplifier stage 16. These splitters 40 output into a bank of eight parallel push-pull amplifiers 42a to 42h. Each of these push-pull amplifiers is configured as described below with reference to FIG. 2, and is supplied with controlled drain voltage from the power supply 20.

Each of the splitters provides two inphase 50 ohm outputs, which are isolated from each other with greater than 20 dB isolation. Combiners, which are described below are complementary inphase devices with similar port-to-port isolation.

The outputs of the amplifiers 42a to 42h are fed into a cascade of combiners 44, which combine the amplified RF signal to provide an output power of about 5000 watts at an impedance of 50 ohms. This combined signal is routed through a low pass filter and a dual directional coupler which are not shown.

Connected with the control circuit 36 are an interface circuit board 46 to connect to emulation circuits (not shown) that effect control of the amplifier 10 and an indicator board 48 which powers various indicators (not shown), for example LEDs that indicate equipment status.

Figure 2:
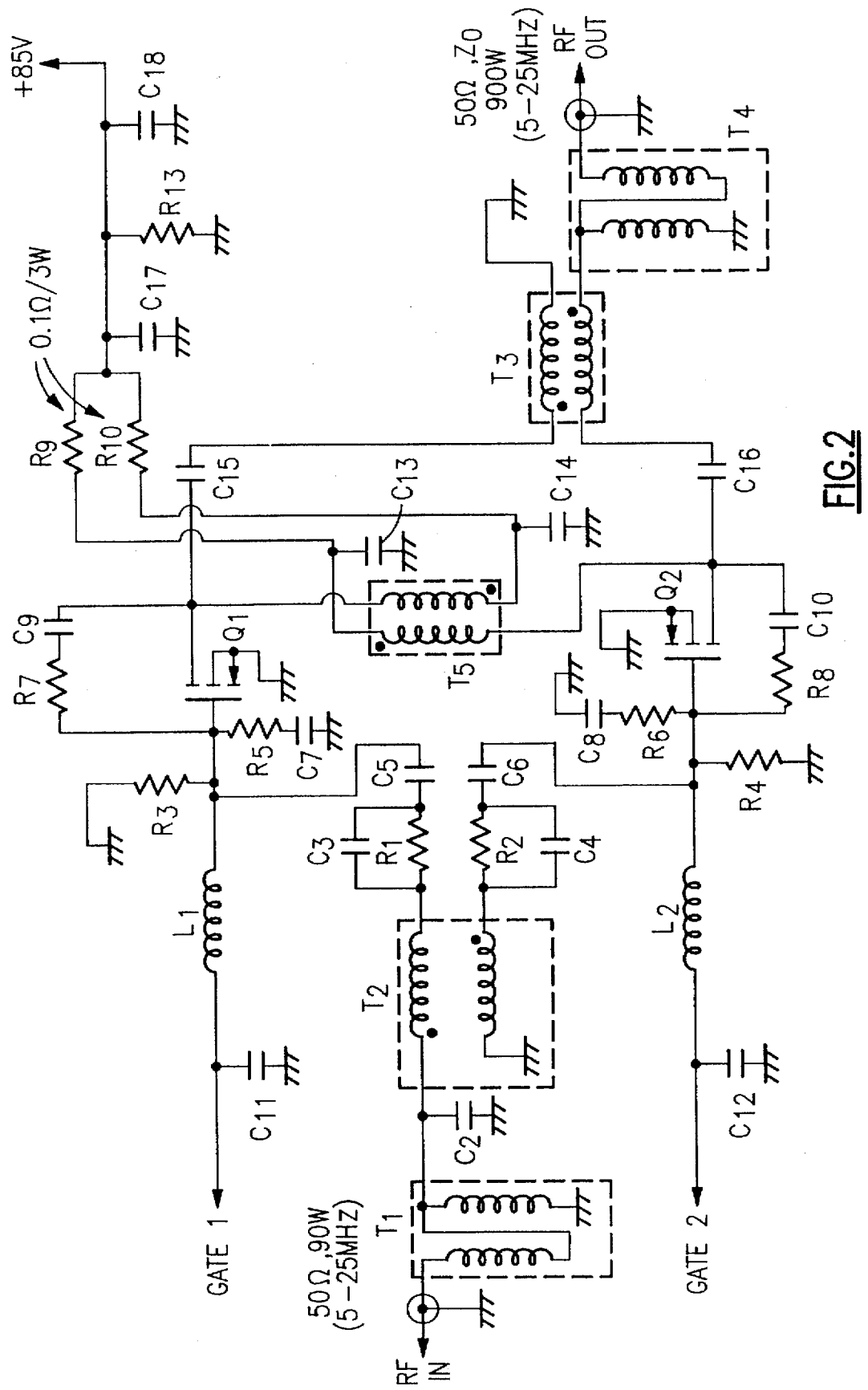
FIG. 2 is a schematic circuit diagram of one push-pull amplifier circuit employing high voltage mosfets, the circuit embodying the concepts of this invention.

The circuitry for each push-pull amplifier pair 42a to 42h is represented schematically in FIG. 2. This amplifier is topologically optimized with a minimum number of transformers (five total) to feed an input signal to, and to combine output signals from, a pair of high voltage mosfets Q1, Q2 which are connected in push-pull (i.e. 180° out of phase).

The high voltage mosfets Q1, Q2 are operated at 85 volts drain-source and each push-pull pair puts out greater than 900 watts of peak RF output power over a 5 to 25 MHz frequency range.

The compression at rated output power is less than 1 dB and the power gain is greater than 9 dB. The circuitry is optimized for output power, drain efficiency, compression, power gain, and dynamic linearity at a desired MRI imaging frequency, requiring little or no adjustment. This results from proper selection of compensation capacitor C2 and feedback resistors R7 and R8. The drain bias current level is optimized for the dynamic linearity.

Transistors Q1, Q2 are high voltage mosfets selected for the characteristics described earlier. Resistors R3, R4 are connected to the gates of the respective mosfets Q1, Q2 to provide dc return paths. These have values chosen for stable operation in the event gating inputs are left unconnected or are not terminated. These can have typical values of about 4.7 K.

Series resistor-capacitor combinations R5, C7 and R6, C8 terminate the respective mosfets Q1, Q2, from gate to source over a broad range of frequencies. The values of the resistors R5, R6 are chosen to provide RF stability without affecting power gain. The capacitors C7, C8 are for dc blocking and their values are chosen not to affect the gating rise and fall times.

Low frequency RF stability is achieved with input resistor-capacitor combinations R1, C3, and R2, C4, connected in series with the gates of the respective mosfets Q1, Q2. These provide attenuation at low frequencies at which the fets RF gain is high, without affecting the gain at high frequencies. This network enhances low frequency RF stability and also provides some low frequency gain compensation. The capacitors C5 and C6 are d.c. blocking capacitors.

Broadband RF stability into high output VSWR loads is achieved with resistor-capacitor combinations R7, C9 and R8, C10 which couple the drain and gate of the respective fets Q1, Q2. These provide RF feedback, and help to match both input and output VSWRs. The values of resistors R7 and R8 are chosen for input and output matching without significantly affecting power gain and output power capability. The capacitors C9 and C10 are dc blocking capacitors, and their values are chosen such that both gating rise and fall times are not affected.

A drain supply of 85 volts is fed via a reversing transformer T5 in which the magnetic flux is cancelled during each RF cycle. The net flux inside the transformer core is zero. Sense resistors R9 and R10 are coupled in series with the respective windings of the transformer T5 to permit individual drain current sensing for each transistor Q1, Q2 by measuring the voltage drop across each resistor. The capacitors C13, C14 and C17 provide RF bypass to ground and are of sufficient capacity and working voltage to handle the required dc voltage. An electrolytic capacitor C18 serves as a low frequency bypass and has a high enough working voltage to sustain the rated dc drain voltage. Resistor R13 is connected in parallel to capacitor C18 from the power supply 20 to ground to bleed static charge build-up from the drains of the fets Q1, Q2, if the power supply 20 becomes disconnected.

An input matching transformer T1 is a 4:1 impedance ratio step-down type with a 50 ohms input tap and a 12.5 ohms output over a range of 5 to 25 MHz. A compensation capacitor C2 in parallel with a low impedance secondary of the matching transformer T1 tunes out any leakage inductance, and is optimized for the entire frequency range.

The transformer T1 has its high impedance (50 ohms) input coupled to an RF input and its low impedance output (12.5 ohms) coupled to an unbalanced input of a balun transformer T2. This balun transformer has a characteristic impedance of 12.5 ohms, and splits the input signal equally in push-pull, i.e. it outputs a pair of balanced signals 180 degrees out of phase. The balun impedances are typically 6.25 ohms to ground for each transistor Q1, Q2.

The effect of input capacitance $C_{ISS}$ as equivalent series capacitor is absorbed by winding inductance of each output leg of the input balun T2.

At an output side of the transistors Q1, Q2, i.e., at the drain, is an output push-pull combiner in the form of a balun transformer T3. This transformer has balanced inputs coupled to the respective drains of the fets through dc blocking capacitors C15, C16. These have respective inputs of 6.25 ohms, separated in phase by 180 degrees, and a single-ended output of 12.5 ohms impedance that is tied to an input of an output matching transformer T4. The latter transformer performs an impedance step-up function, matching 12.5 ohms to 50 ohms. The transformers T3 and T4 cover the entire 5 to 25 MHz band without need for compensation. The effect of transistor output capacitance $C_{OSS}$ at the drain of each fet Q1, Q2 is compensated for by the inductance of the respective balun input legs of the transformer T3.

The output of the transformer T4 at 50 ohms and 900 watts peak is fed to the network of combiners 44 shown in FIG. 1.

Each of the gates of the transistors Q1 and Q2 is coupled through inductors L1 and L2 respectively to a source of gate bias Gate 1 and Gate 2. Respective capacitors C11 and C12 serve as RF bypasses and are chosen not to effect gating rise and fall times.

Figure 3:
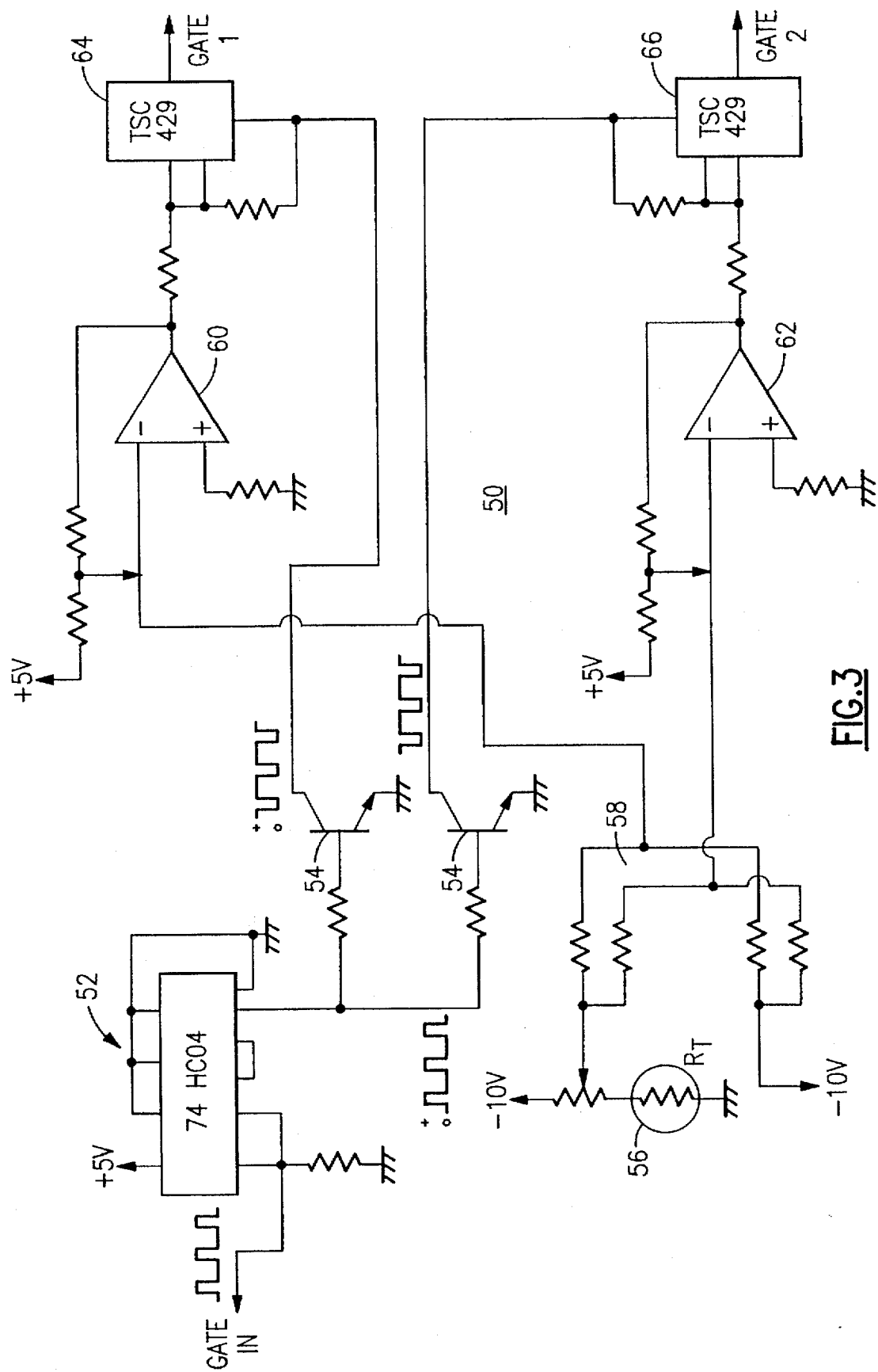
FIG. 3 is a diagram of a gate bias stabilization circuit according to an embodiment of this invention.

A gate bias stabilization circuit 50 is shown in FIG. 3, which provides the gate bias control levels to Gate 1 and Gate 2 for the transistors Q1 and Q2. A gate signal generator 52 generates gating pulses which are fed to respective inverters 54, 54. A temperature sensitive device, i.e., a tempsistor 56 is associated with each given push-pull pair of transistors Q1, Q2 and is connected to a respective latch circuit 64, 66. The latch circuits are gated by the inverters 54. The latch circuits 64 and 66 provide temperature based gate bias levels to Gate 1 and Gate 2 which are updated at each occurrence of the gating pulses.

Figure 4:
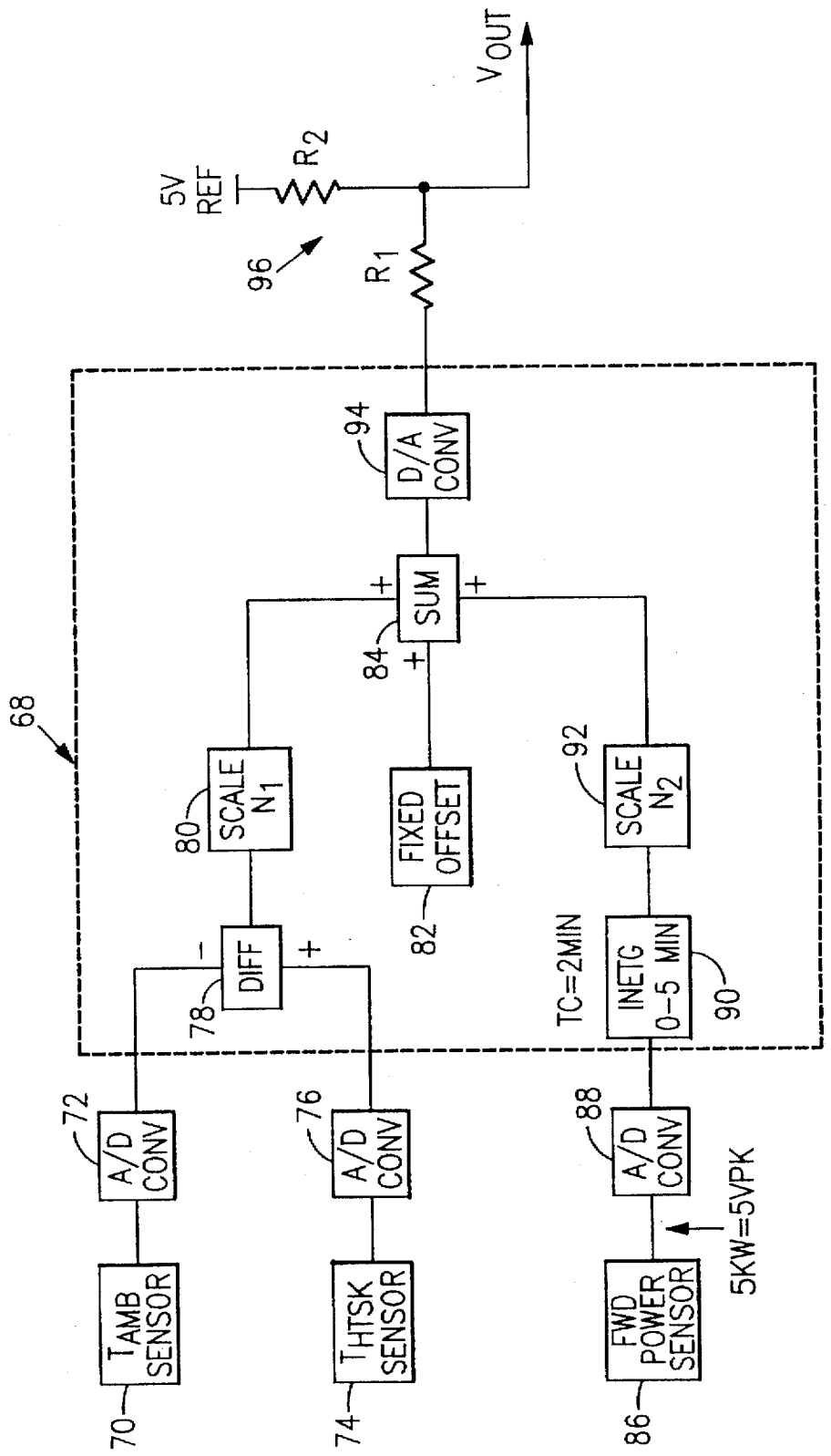
FIG. 4 is a block diagram of a gain stability compensation circuit according to an embodiment of this invention.

FIG. 4 shows a gain stability compensation circuit 68 in block diagram form which is configured as a part of the control circuit 36 (FIG. 1).

An ambient inlet air temperature sensor 70, physically positioned inside the equipment cabinet of the amplifier assembly, outputs a d.c. level that represents the ambient temperature $T_{AMB}$, which is supplied to a converter 72 that generates a corresponding digital value. Another temperature sensor 74 is positioned on the equipment heat sink and outputs a d.c. level that represents the heat sink temperature $T_{HTSK}$, which is fed to an associated converter 76. The converter 76 generates a corresponding digital value. The digital temperature values are supplied to a subtraction circuit 78 that provides a digital value that represents the difference between the two temperatures $T_{HTSK}$ and $T_{AMB}$.

The subtraction circuit is followed by a scaling circuit 80, whose output is a function of this temperature difference.

An offset circuit 82 provides a digital value that corresponds to a predetermined offset voltage. This offset value is provided to a summing circuit 84 which also receives the output of the scaling circuit 80.

A forward power sensor 86 measures the amplifier output power, and its output is digitized in an associated converter 88 and is fed to a digital integrator 90. The latter forms a time integral of forward amplifier power over a period from zero to five minutes of operation with an integration time constant of two minutes. The time integral output is fed from the integrator 90 to a scaling circuit 92 whose output is a function of the time integral of forward power. The output of the scaling circuit 92 is supplied to the summing circuit 84.

The summing circuit thus provides a sum of the functions of temperature difference $T_{HTSK} - T_{AMB}$ and of the time integral of forward power, but accounting for voltage offset. The output of the summing circuit is supplied through a D/A converter 94 to an output circuit 96. The output circuit provides an output voltage which varies in a range, e.g. 4.7 to 5.3 volts, and which controls the output voltage of the power supply 20 from 80 to 90 volts. The actual voltages depend on the die temperature and $R_{DS-on}$ characteristics of the transistors $Q_1$ and $Q_2$.

The drain voltage is varied in accordance with the temperature behavior of the transistor's die to create extremely, stable gain characteristics during the desired time interval (0–5 minutes) as the transistors heat up.

Figure 5:
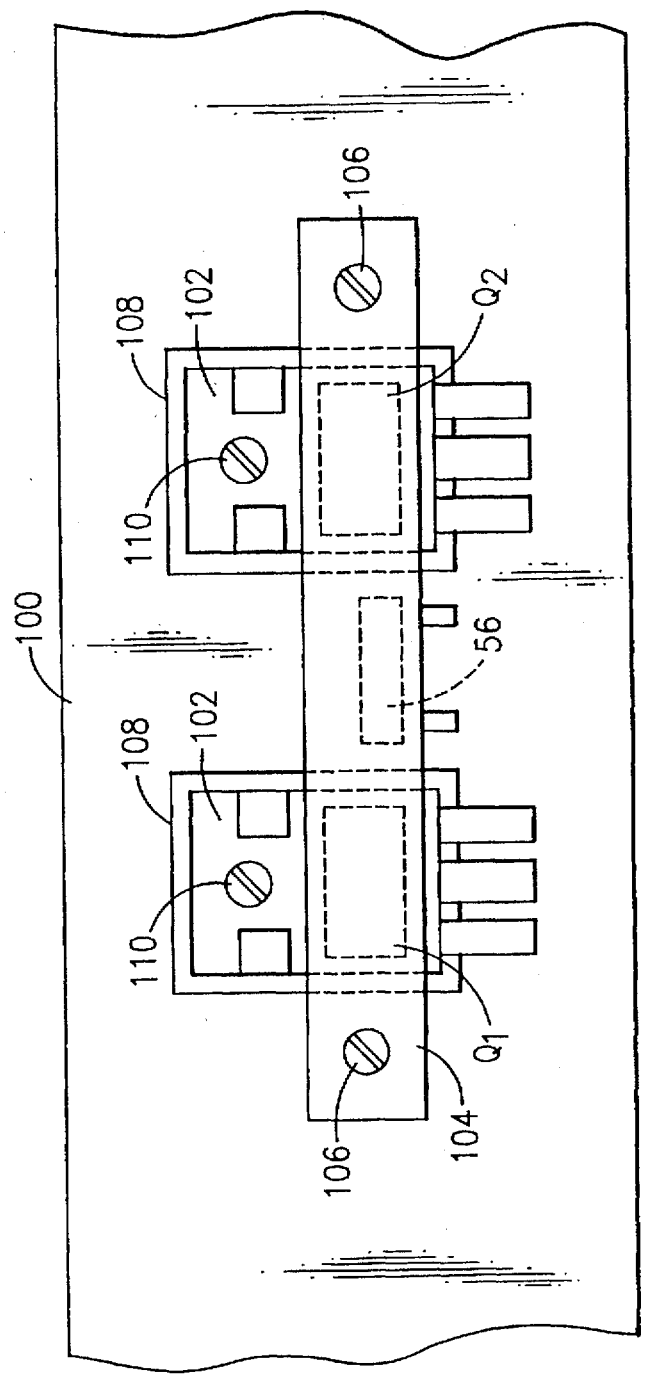
FIG. 5 is a plan view showing mounting of a push-pull pair of high voltage mosfets, according to an embodiment of this invention.

Physical placement of the high voltage mosfet transistors is shown in FIG. 5. A heat sink 100, e.g., in the form of a copper spreader plate, holds a pair of transistor assemblies 102, 102, each of which has a thermally conductive base with plastic encapsulation and contains the active dies of transistors Q1, Q2. These are located approximately at the position shown in ghost lines. A strap 104 of aluminum or fiberglass extends across the two transistor assemblies 102—102 at the positions of the dies, and sandwiches the transistors between itself and the heat sink 100. The strap 104 is held by screws 106 tightly to the heat sink. Insulators 108, e.g. each being a thin layer of sil-pad optimized for thermal conductivity and dielectric constant, are positioned between the transistors 102 and the copper heat sink 100. The strap 104 presses the transistors so that the dies Q1, Q2 are in good thermal contact with the heat sink.

The tempsistor 56 that is associated with these two transistors is mounted directly on the heatsink 100 midway between the transistors. Here the tempsistor closely follows the temperature variations of both transistors of the push-pull pair.

Figure 6:
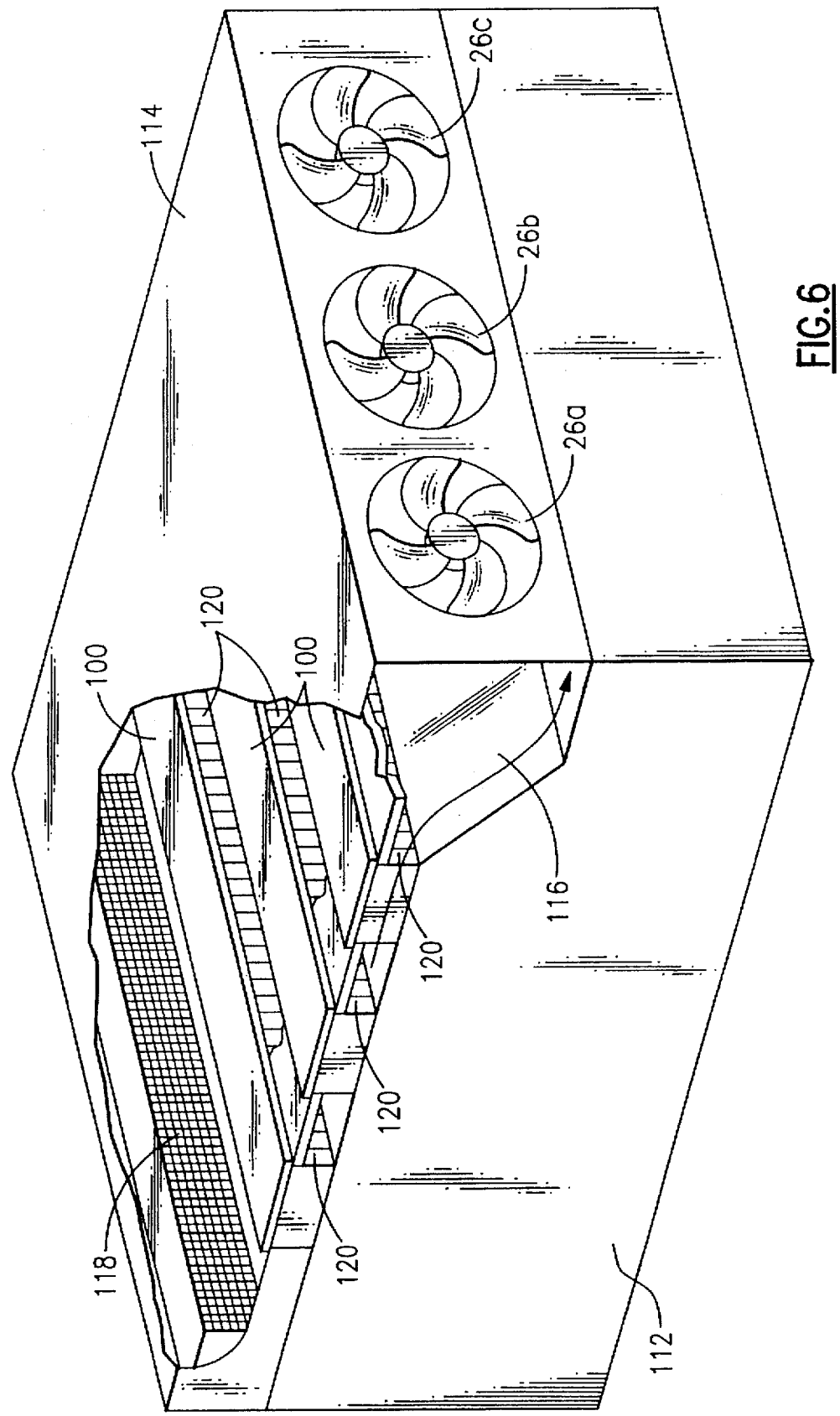
FIG. 6 is a perspective view showing the cabinet or chassis of the amplifier of an embodiment of this invention., partly cut away to show a cooling tunnel feature.

FIG. 6 shows an improved heat management feature in the form of a forced air cooling tunnel of the complete equipment. A housing 112 containing the amplifier is shown with a cover 114 partly cut away to expose the heat sink 100. Elongated cooling fins 120 are formed in the heat sink. A cooling tunnel 116 is defined between the heat sink 100 and cover 114 and extends from an inlet grid 118 to the cooling fans 26a, 26b, 26c.

In this configuration air is directed steadily and uniformly through the cooling tunnel 116 and along the fins 120. This produces even predictable cooling of the various high power transistors.

While this invention has been described in detail with reference to selected preferred embodiments, the invention is not limited to those embodiments. Rather many modifications and variations will present themselves to persons skilled in this art without departure from the scope and spirit of this invention, as defined in the appended claims.

What is claimed is:

1. A push-pull RF power amplifier that comprises first and second high voltage field effect transistors each of which has a drain, a source, and a gate, said transistors each having a predetermined drain-source breakdown voltage; a supply of drain voltage coupled to the drains of said transistors, said supply furnishing said drain voltage at a level that is below said drain-source breakdown voltage to create a safety margin between said drain-source breakdown voltage and a peak drain-source voltage, as defined by said drain voltage level, that is greater than the magnitude of said drain voltage level; a signal input terminal to which an RF signal is applied; an input balun transformer having an unbalanced input coupled to the signal input terminal and first and second balanced outputs coupled to the gates of the respective first and second transistors; first and second bias circuits applying respective bias levels to the gates of said first and second transistors; an output balun transformer having balanced inputs coupled to the drains of said first and second transistors respectively, and an unbalanced output; and means coupling said unbalanced output to an RF output terminal.

2. A push-pull RF power amplifier according to claim 1 further comprising a reversing transformer having first and second windings, each winding having a first terminal connected to the drain of a respective one of the first and second transistors, and a second terminal connected to said supply of drain voltage.

3. A push-pull RF power amplifier according to claim 1 wherein said input matching transformer has an input to output impedance ratio of 4:1.

4. A push-pull RF power amplifier according to claim 1 wherein said output matching transformer has an input to output impedance ratio of 1:4.

5. A push-pull RF power amplifier according to claim 1 wherein said input balun transformer has a characteristic impedance on the order of 12.5 ohms.

6. A push-pull RF power amplifier according to claim 1 wherein said output balun transformer has a characteristic impedance on the order of 12.5 ohms.

7. A push-pull RF power amplifier according to claim 1 wherein said drain voltage is on the order of about one-fourth said predetermined drain-source breakdown voltage.

8. A push-pull RF power amplifier according to claim 7 wherein said drain-source breakdown voltage is on the order of about 400 volts and said drain voltage is on the order of about 90 volts.

9. A push-pull RF power amplifier that comprises first and second high voltage field effect transistors each of which has a drain, a source, and a gate; a supply of drain voltage coupled to the drains of said transistors; a signal input terminal to which an RF signal is applied; an input impedance matching transformer having a high impedance input coupled to said signal input terminal and a low impedance output; an input balun transformer having an unbalanced input coupled to the low impedance output of said input matching transformer and first and second balanced outputs coupled to the gates of the respective first and second transistors; first and second bias circuits applying respective bias levels to the gates of said first and second transistors; an output balun transformer having balanced inputs coupled to the drains of said first and second transistors respectively, and an unbalanced output; an output transformer having a low impedance input coupled to said unbalanced output and a high impedance output coupled to an RF output terminal;

and a reversing transformer having first and second windings, each winding having a first terminal connected to the drain of a respective one of the first and second transistors, and a second terminal connected to said supply of drain voltage.

10. A push-pull RF power amplifier according to claim 9, wherein the first and second windings of said reversing transformer have a turn ratio of 1:1.

11. A push-pull RF power amplifier according to claim 1 further comprising an input impedance matching transformer having a high impedance input coupled to said signal input terminal and a low impedance output coupled to the unbalanced input of said input balun transformer.

12. A push-pull RF power amplifier according to claim 11 wherein said means coupling said unbalanced output to said RF output terminal comprises an output transformer having a low impedance input coupled to said unbalanced output and a high impedance output coupled to said RF output terminal.

* * * * *

UNITED STATES PATENT AND TRADEMARK OFFICE
CERTIFICATE OF CORRECTION

PATENT NO. : 5,726,603

DATED : March 10, 1998

INVENTOR(S) : Chawla et al.

It is certified that error appears in the above-identified patent and that said Letters Patent is hereby corrected as shown below:

Column 2, line 25:
"fete" should read --fets--.

Column 4, line 38:
"derides" should read --devices--.

Column 10, line 9:
"famishing" should read --furnishing--.

Signed and Sealed this

Fifth Day of May, 1998

Attest:

Attesting Officer

BRUCE LEHMAN

Commissioner of Patents and Trademarks